United States Patent [19]

Reynolds et al.

[11] Patent Number: 4,545,967

[45] Date of Patent: Oct. 8, 1985

[54] STABILIZED LANTHANUM SULPHUR COMPOUNDS

[75] Inventors: George H. Reynolds, San Marcos; Norbert B. Elsner, La Jolla; Clyde H. Shearer, San Diego, all of Calif.

[73] Assignee: The United States of America as represented by the United States National Aeronautics and Space Administration, Washington, D.C.

[21] Appl. No.: 469,863

[22] Filed: Feb. 25, 1983

[51] Int. Cl.[4] .............................................. C01F 17/00
[52] U.S. Cl. ................................... 423/263; 423/265; 423/266; 423/275
[58] Field of Search ............... 423/263, 265, 266, 275

[56] References Cited

U.S. PATENT DOCUMENTS

| | | | |
|---|---|---|---|
| 3,009,977 | 11/1961 | Houston | 423/263 |
| 3,086,925 | 4/1963 | Didchenko et al. | 423/263 |
| 3,174,939 | 3/1965 | Suchow | 423/263 |
| 3,247,022 | 4/1966 | Didchenko | 423/263 |

OTHER PUBLICATIONS

Kalinina et al., "Chem. Abstracts", vol. 93, 1980, #124165x.

*Primary Examiner*—H. T. Carter
*Attorney, Agent, or Firm*—Paul F. McCaul; John R. Manning; Thomas H. Jones

[57] ABSTRACT

Lanthanum sulfide is maintained in the stable cubic phase form over a temperature range of from 500° C. to 1500° C. by adding to it small amounts of calcium, barium, or strontium. This novel compound is an excellent thermoelectric material.

3 Claims, No Drawings

STABILIZED LANTHANUM SULPHUR COMPOUNDS

BACKGROUND OF THE INVENTION

1. Field of the Invention

This invention relates to lanthanum sulphur compounds which are stabilized by calcium, barium, or strontium and have desirable properties for use in thermoelectric energy conversion.

2. Background Discussion

Thermoelectric materials are substances which, when subjected to a temperature differential across the material, produce a voltage drop and a current flow through the material. Such materials are used in remote power generation, for example, in a spacecraft as a source of electrical power. One end of the material is exposed to heat, for example, from a radioisotope heat source, and the other end is at a substantially lower temperature caused by intentional heat removal such as radiative coating, subjecting the material to a thermal gradient which causes power to be generated by the material. Thus, heat energy is directly converted to electrical energy to provide power for the spacecraft.

In a material such as lanthanum sulfide, certain crystallographic phases may have desirable thermoelectric properties, while other phases may be electrical insulators. For example, the cubic phase form of lanthanum sulfide exhibits desirable thermoelectric properties over the temperature range of from about 1200° C. to about 1500° C. At temperatures below about 1200° C. the crystal structure of the lanthanum sulfide changes from the cubic phase, which provides the desirable thermoelectric properties, to an orthorhombic form which lacks the desired thermo-electric properties. Such phase transformation can also produce a brittle, fragile material with insufficient strength to be used as a thermoelectric power conversion device.

THE INVENTION

We have discovered that the desirable cubic phase of lanthanum sulfide can be stabilized over a broad temperature range by dissolving calcium, barium, or strontium in the lanthanum sulfide. This material may be represented by the following formula:

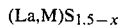

$(La,M)S_{1.5-x}$ where x is greater than 0 and less than 0.1, and M is selected from the group consisting of calcium, barium, strontium, and mixtures thereof. The amount of calcium, barium, and strontium used should be effective to maintain the desired cubic phase of the lanthanum sulfide at temperatures of 500° C. or lower. Typically, the amount of calcium, barium, or strontium ranges between about 0.1 and about 5.0 weight percent of the compound, and preferably is in the range from about 0.2 to about 5 weight percent, to stabilize the cubic phase and provide a useful thermoelectric material which is usable in the temperature range of from about 500° to about 1500° C.

The thermoelectric material of this invention may be made by simply blending together at room temperature powders of the elemental ingredients (La, S, Ba, Ca, Sr) in the correct proportions. This blend is slowly heated in vacuum to a temperature of approximately 1100°–1200° C. and at this temperature for a sufficient amount of time for chemical homogenization to occur. Alternately, the starting metallic ingredients may be reacted with sulphur vapor at a temperature of 600°–1200° C. in a closed reaction vessel. The proportion of starting materials is such that the finished material has the above formula. Also, a mixture of the compound lanthanum sulfide and compounds barium sulfide, calcium sulfide, and/or strontium sulfide may be heated to 1100°–1200° C. in vacuum for a time sufficient to form the desired material.

In some instances it may be desirable to heat the starting ingredients to temperatures in excess of 1200° C. to melt the ingredient. The finished product is cooled and then crushed or ground into powder and then fabricated into a thermoelectric device by known powder metallurgical techniques such as vacuum hot pressing.

The following example illustrates the preferred way of making the compound of the present invention.

EXAMPLE I

A mixture of 138.9 grams of lanthanum powder, 58.1 grams of sulphur powder, and 7.9 grams of calcium powder were blended together in an inert, protective atmosphere and loaded into a quartz reaction vessel. The vessel was evacuated and sealed and slowly heated to 1100° C. for several days to homogenize the mixture. The reacted mixture was removed from the quartz reaction vessel, ground to powder, and vacuum hot pressed at 1400° C. for one hour to form a solid thermoelectric element.

The above description presents the best mode contemplated of carrying out the present invention. The compounds of this invention are, however, susceptible to modifications and alternate ways of preparing them. Consequently, it is not the intention to limit this invention to the particular example disclosed. On the contrary, the invention is to cover all modifications and alternate forms of the compounds falling within the spirit and scope of the invention as expressed in the appended claims.

What is claimed is:

1. The method of forming a thermoelectric material of lanthanum sulfide which exhibits a stable phase form over a temperature range from about 500° C. to 1500° C. wherein thermoelectric properties exist, said method comprising the steps of:

blending at room temperature lanthanum sulfide and an ingredient selected from calcium, barium or strontium to form a lanthanum sulfide compound having the following formula:

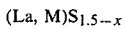

$(La, M)S_{1.5-x}$ where x is greater than 0 and less than 0.1 and M is selected from the group consisting of calcium, barium or strontium, and M is present in an amount sufficient to stabilize the cubic phase of said material at temperatures as low as about 500° C.;

selecting M in an amount ranging from 0.1 to 5.0 weight percent;

slowly heating the blended ingredients in a vacuum to a temperature of about 1100° to 1200° C.;

allowing a chemical homogenization to occur; and fabricating said thermoelectric material from the homogenized compound.

2. The method of forming a thermoelectric material of lanthanum sulfide which exhibits a stable cubic phase form over a temperature range from about 500° C. to 1500° C. wherein thermoelectric properties exist, said method comprising the steps of:

reacting lanthanum and an ingredient selected from calcium, barium or strontium with a sulfur vapor at a temperature of about 600° C. to 1200° C. in a closed reaction vessel to form a lanthanum sulfide compound having the following formula:

$(La, M)S_{1.5-x}$ where x is greater than 0 and less than 0.1 and M is selected from the group consisting of calcium, barium or strontium, and M is present in an amount ranging from 0.1 to 5 weight percent sufficient to stabilize the cubic phase of said material at temperatures as low as about 500° C.;

selecting M in an amount ranging from 0.1 to 5.0 weight percent;

allowing a chemical homogenization to occur in the reaction vessel; and fabricating said thermoelectric material from the homogenized compound.

3. The method of forming a thermoelectric material of lanthanum sulfide which exhibits thermoelectric properties over a temperature range from about 500° C. to 1500° C. by exhibiting a stable cubic phase form over said temperature range, said method comprising the steps of:

individually heating to about 1200° C. the ingredients of lanthanum, sulphur and one ingredient selected from calcium, barium, or strontium to form a lanthanum sulfide compound having the following formula:

$(La, M)S_{1.5-x}$ where x is greater than 0 and less than 0.1 and M is selected from the group consisting of calcium, barium, and strontium, and M is present in an amount ranging from 0.1 to 5 weight percent sufficient to stabilize the composition in it's cubic crystalline phase at temperatures as low as about 500° C.;

cooling the heated compound;

crushing the compound into powder; and fabricating said thermoelectric material from said powder.

* * * * *